(12) United States Patent
Altunyurt et al.

(10) Patent No.: US 9,515,031 B2
(45) Date of Patent: Dec. 6, 2016

(54) MITIGATION OF FAR-END CROSSTALK INDUCED BY ROUTING AND OUT-OF-PLANE INTERCONNECTS

(75) Inventors: Nevin Altunyurt, Chandler, AZ (US); Kemal Aygun, Chandler, AZ (US); Kevin J. Doran, North Plains, OR (US); Yidnekachew S. Mekonnen, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 152 days.

(21) Appl. No.: 13/976,447

(22) PCT Filed: Dec. 29, 2011

(86) PCT No.: PCT/US2011/067976
§ 371 (c)(1),
(2), (4) Date: Jun. 26, 2013

(87) PCT Pub. No.: WO2013/101127
PCT Pub. Date: Jul. 4, 2013

(65) Prior Publication Data
US 2014/0203417 A1    Jul. 24, 2014

(51) Int. Cl.
*H01L 23/66*    (2006.01)
*H01L 21/768*   (2006.01)
(Continued)

(52) U.S. Cl.
CPC ............. *H01L 23/66* (2013.01); *H01L 21/768* (2013.01); *H01L 23/49838* (2013.01);
(Continued)

(58) Field of Classification Search
CPC ...... H01P 3/08; H01L 23/66; H01L 23/49838; H01L 23/64; H01L 21/768; H05K 1/0228; H05K 1/0248; H05K 1/0251
(Continued)

(56) References Cited

U.S. PATENT DOCUMENTS 6,538,538 B2   3/2003  Hreish et al.
7,109,569 B2   9/2006  Breisch et al.
(Continued)

OTHER PUBLICATIONS

International Search Report and Written Opinion for International Application No. PCT/US20111/067976, dated Sep. 27, 2012, 13 pp.
(Continued)

*Primary Examiner* — Stephen E Jones
*Assistant Examiner* — Scott S Outten
(74) *Attorney, Agent, or Firm* — Konrad Raynes Davda & Victor LLP

(57) ABSTRACT

In accordance with one aspect of the present description, a transmission line such as a microstrip or stripline transmission line, has stub-shaped projections adapted to compensate simultaneously for both far-end crosstalk (FEXT) induced by inductive coupling between the transmission line and an adjacent transmission line, and also far-end crosstalk induced by inductive coupling between the vertical electrical interconnect at the far end of the transmission line and an adjacent vertical electrical interconnect electrically connected to the adjacent transmission line. In another aspect of the present description, a microstrip transmission line may have multiple stubby line sections having different resistances and impedances to more gradually transition from to the typically low impedance characteristics of vertical interconnects such as the PTH vias and socket connectors. Other aspects are described.

36 Claims, 9 Drawing Sheets

(51) Int. Cl.
*H01L 23/64* (2006.01)
*H01P 3/08* (2006.01)
*H05K 1/02* (2006.01)
*H01L 23/498* (2006.01)

(52) U.S. Cl.
CPC ............... *H01L 23/64* (2013.01); *H01P 3/08* (2013.01); *H05K 1/0228* (2013.01); *H05K 1/0248* (2013.01); *H05K 1/0251* (2013.01); *H01L 23/49827* (2013.01); *H01L 2223/6627* (2013.01); *H01L 2224/32225* (2013.01); *H01L 2924/0002* (2013.01); *H01L 2924/15311* (2013.01)

(58) Field of Classification Search
USPC .......................................................... 333/246
See application file for complete search history.

(56) References Cited

U.S. PATENT DOCUMENTS

| | | |
|---|---|---|
| 2004/0000709 A1 | 1/2004 | Delacruz |
| 2010/0207700 A1 | 8/2010 | Park et al. |
| 2010/0327989 A1 | 12/2010 | Abbott et al. |
| 2011/0090028 A1 | 4/2011 | Park et al. |

OTHER PUBLICATIONS

International Preliminary Report on Patentability (IPRP) for International Application No. PCT/US2011/067976, dated Jul. 10, 2014, 9 pp.
Eged, B., et al., "Reduction of Far-End Crosstalk on Coupled Microstrip PCB Interconnect", Manuscript for the IEEE Instrumentation and Measurement Technology Conference, May 1994, 8 pp.
Lee, S.-K., et al., "FEXT-Eliminated Stub-Alternated Microstrip Line for Multi-Gigabit/Second Parallel Links", Electronics Letters, vol. 44, No. 4, Feb. 14, 2008, 2 pp.
Sohn, Y.-S., et al., "Empirical Equations on Electrical Parameters of Coupled Microstrip Lines for Crosstalk Estimation in Printed Circuit Board", IEEE Transactions on Advanced Packaging, vol. 24, No. 4, Nov. 2001, 7 pp.
Wikipedia, "Microstrip", [online], Last Modified Oct. 31, 2011, [Retrieved on Nov. 16, 2011], Retrieved from the Internet at <URL: http://en.wikipedia.org/wiki/Microstrip>, 4 pp.
Wikipedia, "Stripline", [online], Last Modified Nov. 1, 2011, [Retrieved on Nov. 16, 2011], Retrieved from the Internet at <URL: http://en.wikipedia.org/wiki/Stripline>, 2 pp.

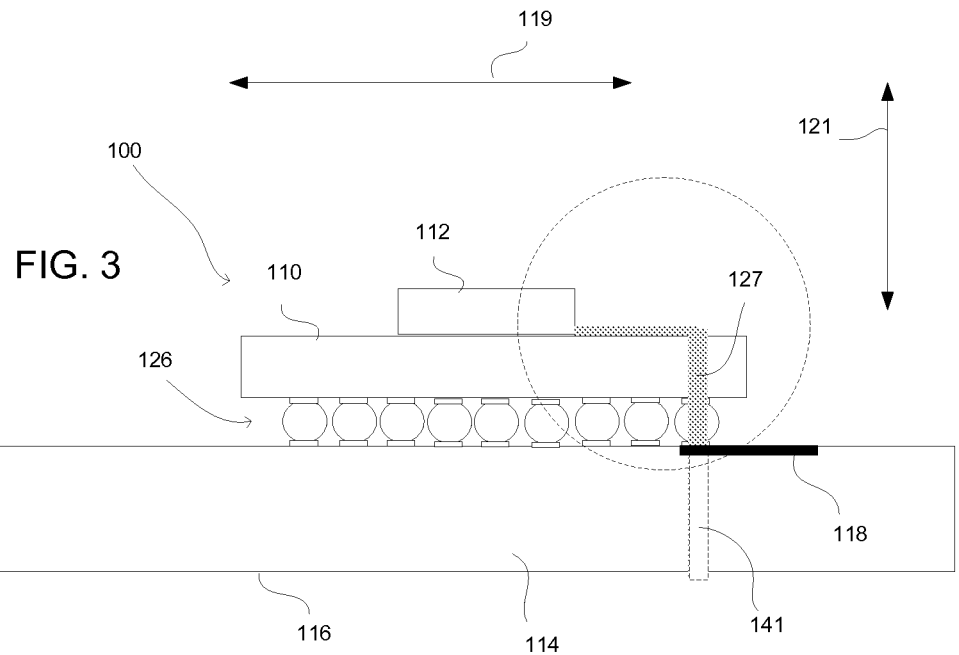
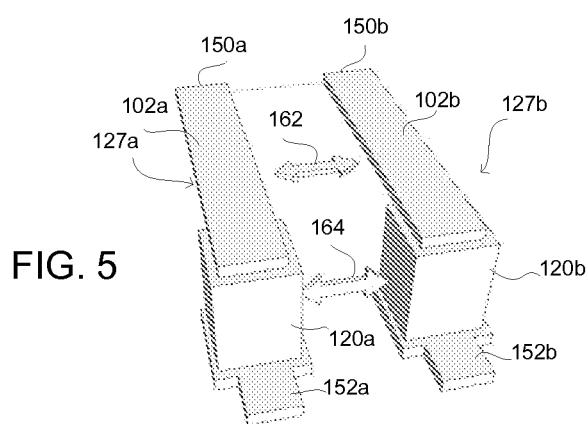

|  | DQ-Write | | | | | | DQ-Read | | | | | |
|---|---|---|---|---|---|---|---|---|---|---|---|---|
|  | 2.4 GT/S | | 2.7 GT/s | | 3.2 GT/s | | 2.4 GT/s | | 2.7 GT/s | | 3.2 GT/s | |
|  | EH | EW | EH | EW | EH | EW | EH | EW | EH | EW | EH | EW |
| 600 | +11 mV | +5 ps | +1 mV | +5 ps | +6 mV | +9 ps | +9 mV | +6 ps | +17 mV | +9 ps | +13 mV | +17 ps |
| 610 | +13 mV | +6 ps | +4 mV | +5 ps | +3 mV | +4 ps | +17 mV | +13 ps | +24 mV | +15 ps | +26 mV | +21 ps |

MITIGATION OF FAR-END CROSSTALK INDUCED BY ROUTING AND OUT-OF-PLANE INTERCONNECTS

BACKGROUND

Description of Related Art

Integrated circuits in a system are often packaged in packages which are frequently mounted on substrates such as a printed circuit board which has conductors to interconnect the integrated circuit packages together. One such system, for example, includes one or more microprocessors, memory, graphics processors and other complex integrated circuits packaged in packages and mounted and interconnected on a printed circuit board or other substrate. As the input/output (I/O) data rates between high speed integrated circuits in a system continue to increase, crosstalk between adjacent signal paths can contribute to overall I/O channel performance degradation.

Integrated circuit packages often use transmission structures such as striplines and microstrips disposed in or on a package substrate, to conduct signals between the die of the integrated circuit contained within the package, and external connectors of the package which connect to sockets, pads or other connectors of the printed circuit board.

Striplines are frequently used to route signals in a package where crosstalk is a concern because striplines frequently have superior crosstalk performance as compared to microstrips. However, because microstrips typically may be fabricated with fewer layers as compared to striplines, microstrips are typically less expensive.

S.-K. Lee et al. in "FEXT-eliminated stub-alternated microstrip line for multi-gigabit/second parallel links," Electronics Letters, Vol. 44, No. 4, Feb. 14, 2008, (hereinafter the S.-K. Lee et al. article) discusses a parallel line microstrip similar to that shown in FIG. 1 herein. The microstrip has two parallel lines, line 1 and line 2. With respect to such parallel line microstrips, the S.-K. Lee et al. article states:

"Microstrip line, which is typically used for parallel links on PCB, causes near-end crosstalk (NEXT) and far-end crosstalk (FEXT) by electromagnetic coupling. In a parallel-terminated interface, the FEXT is more problematic than NEXT since it seriously affects the signal integrity at the receiver side. When the input of $V_i$ is applied, the FEXT-induced voltage at the receiver side, $V_f$, can be expressed as $$V_f(t) = \frac{t_f}{2}\left(\frac{C_m}{C_S} - \frac{L_m}{L_S}\right)\frac{dV_i(t-t_f)}{dt} \quad (1)$$

where $t_f$ is the time of flight. $C_m$, $C_S$, $L_m$ and $L_S$ represent the mutual capacitance, self capacitance, mutual inductance and self inductance of transmission line per unit length. The parallel microstrip lines have smaller $C_m/C_S$ than $L_m/L_S$ owing to the non-homogeneity with upper side exposed to air [reference omitted], resulting in finite FEXT voltage proportional to the line length and signal transition rate. As shown . . . , the FEXT voltage causes a difference in propagation delay between the even- and odd-mode signals. Therefore the FEXT-induced jitter reduces the eye opening [3] and limits high-speed transmission . . . "

To improve the performance of microstrips, the S.-K. Lee et al. article proposes stub-alternated parallel microstrip lines as shown in FIG. 2 herein. With respect to such stub-alternated parallel microstrip lines, the S.-K. Lee et al. article states:

". . . Stubs are uniformly distributed along the transmission lines. w is the width of the line, and s is the space between two neighbouring lines. In this work, as a typical case, s was fixed to be 3 w. The stub width was also fixed to be the same as the line width, w. Then the stub configuration can be simply characterised by two parameters, x and y, indicating the stub length and the space, respectively, as shown in FIG. 2.

The increase in electric field around edges of the stubs induces larger capacitive coupling, while the inductive coupling is affected little since the stubs are perpendicular to the current flow. The increase in the self and the mutual capacitances due to the addition of the stubs also increases $C_S$, but the ratio $C_m/C_S$ increases further and can be eventually equal to $L_m/L_S$, resulting in zero FEXT. If the propagation delay through the unit structure with the length of 2(y+w) is sufficiently small compared with the signal transition time, structure uniformity is valid and this stub-alternated line can be regarded as a transmission line."

BRIEF DESCRIPTION OF THE DRAWINGS

Referring now to the drawings in which like reference numbers represent corresponding parts throughout:

FIG. 3 is a schematic diagram illustrating an integrated circuit package vertically disposed over a printed circuit board and depicting an I/O channel using stubby line microstrip transmission lines in accordance with one embodiment of the present description;

FIG. 5 schematically represents a pair of adjacent I/O channels between a pair of transmitters and a pair of receivers for the package of FIG. 3;

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

As noted above, to improve the FEXT performance of microstrips, the S.-K. Lee et al. article proposes stub-alternated parallel microstrip lines. Another publication, U.S. Pat. Pub. No. US 2010/0327989 discusses a microstrip having a compensating portion which has a longitudinal section and a plurality of alternating stubs extending from the longitudinal section. The U.S. Pat. Pub. No. US 2010/0327989 publication, published less than one year prior to the priority date of this disclosure, discusses:

" . . . Thus, employing the above techniques to single-ended interconnect implementations in which DDR3 signals are routed on external layers could provide significant advantages. For example, compensation through the application of a "stubby" micro-strip can 1) substantially reduce or eliminate transmission line induced crosstalk from neighboring lines, 2) improve timing margins by substantially reducing or eliminating crosstalk-induced jitter, 3) allow for tighter grouping between signals on the printed circuit board, and 4) compensate for crosstalk induced in densely routed escape regions, like package and ball grid array (BGA) break-outs, and package and socket induced crosstalk . . . "

However, it is recognized herein that as the input/output (I/O) data rates for central processing units (CPUs) in microprocessor systems and other complex integrated circuits continue to increase, not just horizontal routing but also vertical interconnects in integrated circuit packages and sockets can increase crosstalk significantly which can contribute to the overall I/O channel performance degradation. To mitigate the crosstalk induced from package routing in high speed devices, stripline transmission lines are typically used because of their superior far-end crosstalk (FEXT) performance compared to that of microstrip transmission lines. However, stripline routing in a package generally has two extra package layers compared to microstrip line routing topology and hence can add cost to the overall package manufacturing and assembly. Therefore, if microstrip routing can be used for complex integrated circuits having very high I/O data rates, it is believed that a significant cost reduction may be obtained by reducing the package layer count. As explained in greater detail below, a microstrip routing in accordance with the present description can, it is believed, in some applications provide for the same or better performance compared to stripline routing.

Figure 1:
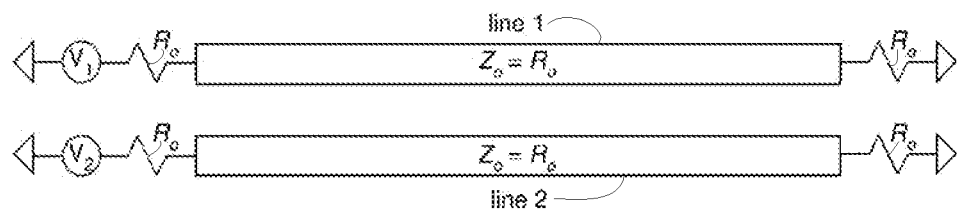
FIG. 1 is a schematic diagram illustrating a prior art microstrip transmission line.
Figure 2:
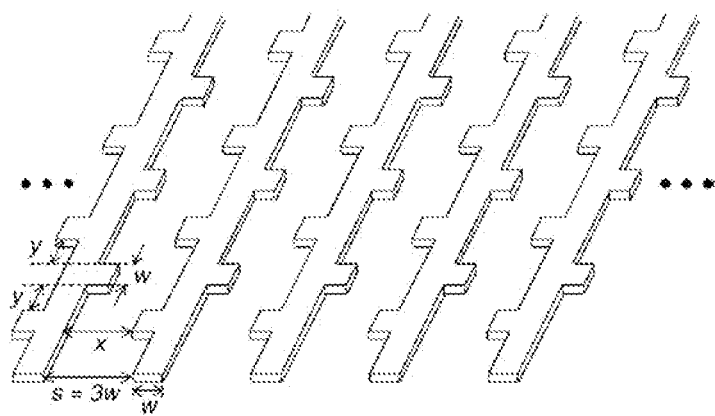
FIG. 2 is a schematic diagram illustrating another prior art microstrip transmission line.
Figure 4:
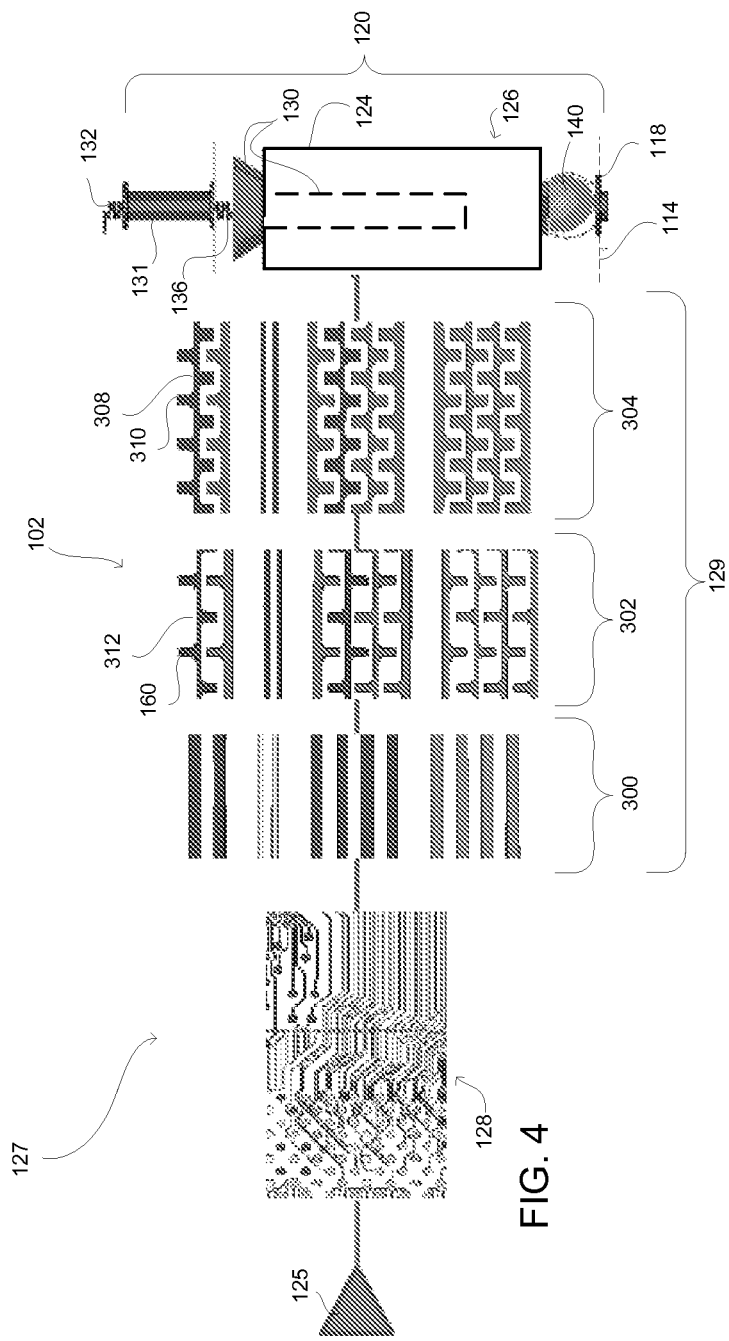
FIG. 4 is a schematic diagram illustrating sections of microstrip transmission lines having capacitances in accordance with one embodiment of the present description and shown disposed between a package breakout region and vertical interconnects of the package.

In accordance with one aspect of the present description, a microstrip transmission line has stub-shaped projections adapted to compensate simultaneously for both far-end crosstalk induced by inductive coupling between the microstrip transmission line and an adjacent microstrip transmission line, and also far-end crosstalk induced by inductive coupling between the out-of-plane vertical electrical interconnect at the far end of the microstrip transmission line and an adjacent vertical electrical interconnect electrically connected to the adjacent microstrip transmission line. FIG. 4 is a schematic diagram illustrating sections of stubby line microstrip transmission lines having capacitances in accordance with one embodiment of the present description, which are overly capacitive to compensate not only for far-end crosstalk induced by inductive coupling between the microstrip transmission line and an adjacent microstrip transmission line, but also for far-end crosstalk induced by inductive coupling between the vertical electrical interconnect at the far end of the microstrip transmission line and an adjacent vertical electrical interconnect. For example, vertical interconnects such as plated through hole (PTH) vias and socket pins may have a high degree of inductive coupling. In one feature of the present description, it is believed that not only FEXT in a microstrip transmission line may be reduced or eliminated, but also the FEXT of the overall combined routing and vertical interconnects may be reduced or eliminated in some applications.

It is believed that reduction or elimination of FEXT due to vertical interconnects can be improved when stubby lines routed right next to each other (immediate adjacent or immediate neighbor) are connected to vertical interconnects that are right next to each other such as two PTH vias that are right next to each other and two socket pins that are right next to each other. Thus, compensation in accordance with the present description may have improved results where the vertical interconnects are immediately adjacent, that is, immediate neighbors.

In another aspect of the present description, a microstrip transmission line may have multiple stubby line sections having different impedances to more gradually transition from the typically high impedance characteristic of the escape and breakout region in a package to the typically low impedance characteristics of vertical interconnects such as the PTH vias and socket connectors.

Thus, it is believed that microstrip compensation in accordance with the present description can not only reduce or eliminate the FEXT problem of package microstrip routing but can also facilitate achieving parity or better performance as compared to package stripline routing since compensation may be directed to compensating for overall package and socket crosstalk.

As previously mentioned, although microstrip routing can require as few as two package layers to be implemented, stripline routing has more frequently been used in many applications for I/O routing due to its superior FEXT performance compared to microstrip routing. Moreover, it is recognized herein that vertical interconnects (such as PTH vias and socket pins, for example) can contribute considerably to overall package crosstalk which can significantly degrade channel performance. It is believed that that microstrip compensation in accordance with the present description that facilitates use of microstrip routing instead of stripline routing, while reducing or eliminating both routing and vertical interconnect crosstalk, can provide a significant cost reduction opportunity and performance improvement, depending upon the particular application.

FIGS. 3 and 4 show one embodiment of a package 100 (FIG. 3) employing microstrip transmission lines 102 (FIG. 4) configured to compensate for overall package routing and package vertical interconnect crosstalk. The package 100 includes a substrate 110 and an integrated circuit die 112 disposed on the substrate 110. The die 112 has an integrated circuit such as a central processing unit (CPU) in a microprocessor system formed on the die 112.

The package 100 is shown disposed on a substrate 114 of a printed circuit board 116 which has conductor traces 118 formed on the substrate 114 of the printed circuit board 116. The microstrip transmission lines 102 of the package 100 are disposed horizontally on the package substrate 110. As used herein, the term "horizontal" refers to an orientation 119 of the microstrip transmission lines 102 which is generally parallel to the orientation of the package substrate 110 as shown in FIG. 3.

The microstrip transmission lines 102 of the package 100 are electrically connected to conductor traces 118 on the printed circuit board 116 by vertical interconnects, an example of which is shown at 120 in FIG. 4. As used herein, the term "vertical" refers to an out-of-plane orientation 121 transverse to the orientation 119 of the microstrip transmission lines 102 of the package substrate 110 as shown in FIG. 3. In accordance with one aspect of the present description, the microstrip transmission lines 102 are adapted to compensate simultaneously for the combined far-end cross talk of both far-end crosstalk induced by inductive coupling between the microstrip transmission lines 102 and far-end crosstalk induced by inductive coupling between the vertical electrical interconnects 120.

In the illustrated embodiment, a vertical interconnect 120 includes a female socket connector 124 of a socket 126 disposed on the printed circuit board 116. FIG. 4 illustrates the main components of a typical I/O channel 127 on a package such as the 100 and a socket such as the socket 126. The components of the I/O channel 127 for transmitting an I/O signal between a signal input/output 125 of the die 112 and a receiver 118 of the printed circuit board 116, include a bump-out escape and breakout routing region 128 of the package 100, a main routing region 129 of the package 100, and the vertical interconnects 120 of the package 100, the socket 126 and the printed circuit board 116. The bump-out escape and breakout routing region 128 is typically routed highly densely due to die bump pitch scaling. The main routing region 129 couples the bump-out escape and breakout routing region 128 to the vertical interconnects 120, and, in the illustrated embodiment, includes the microstrip transmission lines 102 configured in accordance with the present description.

In the illustrated embodiment, the die 112 is described as including a CPU having high speed I/O channels to the printed circuit board 126. It is appreciated that the die 112 may have other types of complex, high speed integrated circuits including graphics processors, memory, network adapters, and signal processors for example. Although the main routing region 129 is depicted as utilizing microstrip transmission lines, it is appreciated that stripline transmission lines may be used, depending upon the particular application.

In the illustrated embodiment, a vertical interconnect 120 further includes a male socket pin connector 130 extending externally from the substrate 110 of the package 100. Each male socket pin connector 130 physically engages an associated female socket connector 124 of a socket 126 on the printed circuit board 116, and electrically connects a microstrip transmission line 102 of the package 100 to the associated female socket connector 124.

In the illustrated embodiment, a vertical interconnect 120 further includes a plated through hole (PTH) via 131 which passes through the substrate 110 of the package 100. The distal ends 132 of the microstrip transmission lines 102 are electrically connected to the male socket pin connectors 130 by the PTH vias 131. If a PTH via 131 is not vertically aligned and directly physically connected to the associated male socket pin connector 130, a portion 136 of a microstrip transmission line may be used to electrically connect the distal end of the PTH via 131 to the proximal end of the associated male socket pin connector 130.

In the illustrated embodiment, a vertical interconnect 120 further includes a bond 140 which may be a solder ball, for example, which bonds the distal end of the female socket connector 124 to the conductor trace 118 of the printed circuit board 116. In this example, the signal input/output 125 of the die 112 may be considered to be a transmitter end for the I/O channel 127, transmitting an I/O signal to the conductor trace 118 which may be considered a receiver end for the I/O channel 127. It is appreciated that the roles of the signal input/output 125 of the die 112 and the conductor trace 118 of the printed circuit board 116 may be reversed, depending upon the signal direction. Also, in some embodiments, the vertical interconnects 120 can extend into and through the printed circuit board substrate 114 or other substrate to a more distant receiver as indicated at 141.

Although the vertical interconnects 120 are depicted as including PTH vias and socket pins in the example of FIG. 4, it is appreciated that compensation techniques in accordance with the present description may be applied to other types of vertical interconnects. For example, instead of socket pins, package technology might use Ball Grid Array (BGA) technology as vertical connects, wherein solder balls, for example, may be used instead of socket pins. Other types of vertical interconnects may be used, depending upon the particular application.

Integrated circuit package transmission lines generally introduce near-end crosstalk (NEXT) at the proximal end of the transmission lines and FEXT at the distal end due to electromagnetic coupling between the lines. It is recognized herein that the package and socket vertical interconnects also significantly contribute to the crosstalk in the I/O channel. In high-speed I/O channels, it is recognized herein that FEXT has significant degradation to the overall channel performance since the FEXT can affect the signal integrity at the receiver end. For input signal $V_i$ applied at a trans-mitter, the FEXT induced voltage $V_f$ at the receiver side can be expressed as $$V_f(t) = \frac{t_f}{2}\left(\frac{C_m}{C_T} - \frac{L_m}{L_s}\right)\frac{dV_i(t-t_f)}{dt},$$

where $t_f$ is the time of flight. Absent compensation in accordance with the present description, $C_m$ is the per-unit-length mutual capacitance and $C_T$ is the sum of the mutual and self capacitances $C_T=C_S+C_m$ of the transmission line, and $L_m$ and $L_S$ are the per-unit-length mutual and self inductance of the transmission line, respectively. Absent compensation in accordance with the present description, and due to the non-homogeneity of microstrip line topology, the capacitance ratio $C_m/C_T$ is smaller than the inductance ratio $L_m/L_s$ resulting in non-zero FEXT at the receiver according to the equation above. As a result, the induced FEXT voltage can cause a propagation delay between even- and odd-mode signals, which can induce FEXT-induced jitter that can reduce the eye opening and thus can adversely impact achieving a targeted transfer rate. As a consequence, microstrip transmission lines have frequently not been selected for use in packages for high-speed signaling products at higher data rates.

In accordance with the present description, it is recognized that $C_m$, $C_S$, $L_m$ and $L_S$ can represent the combined mutual capacitance, self capacitance, mutual inductance and self inductance of not only the transmission line per unit length but also that of the vertical interconnects of the package and printed circuit board. Thus, in one aspect of the present description, to mitigate high FEXT contribution of the vertical interconnects such as the vertical interconnects 120 (FIG. 4), the main routing region 129 of the package 100 (FIG. 3) may be routed with stubby line transmission lines such as the microstrip transmission lines 102 which have stub-shaped projections such as the stub-shaped projections 160, for example. The stubby line microstrip transmission lines 102 are configured to have overly-capacitive mutual coupling to compensate for both the inductive coupling between the adjacent signal lines, as well the inductive coupling between the adjacent vertical interconnects 120 including the PTH vias 131, socket pins 130, and female socket connectors 124.

It is recognized herein that when the stubby line microstrip transmission lines 102 are designed overly capacitive in accordance with the present description, the capacitance ratio $C_m/C_T$ of the stubby line microstrip transmission lines 102 portion of the I/O channel 127 as set forth in the equation above, can be higher than the inductive ratio $L_m/L_s$ of the stubby line microstrip transmission lines 102 portion of the I/O channel 127, resulting in a positive FEXT at the end of the stubby line microstrip transmission lines 102. However, when this overly capacitive coupling between the adjacent stubby line microstrip transmission lines 102 (resulting in positive FEXT) is combined with the inductive coupling between the adjacent vertical interconnects 120 including the adjacent PTH vias 131, socket pins 130, and female socket connectors 124, (resulting in negative FEXT), the overall package FEXT of the I/O channel can be reduced or eliminated. Therefore, it is recognized that by suitably configuring the stubby line microstrip transmission lines 102, the capacitive ratio $C_m/C_T$ of the stubby line microstrip transmission lines 102 portion of the I/O channel 127 may be optimized such that the capacitive and inductive ratio difference in the equation above can approach or attain zero at the receiver 118 output of the vertical interconnects 120 in the channels 127.

Although microstrip routing is depicted in FIG. 4, for example, it is appreciated that stubby line routing in accordance with the present description, may be applied to stripline routing as well, to compensate for the FEXT inducted by vertical interconnects including PTH vias, socket pins and socket connectors. As such, it is believed that the overall FEXT performance of a package having stripline routing may be improved to facilitate higher I/O transfer speeds in high performance applications, for example. Further, although FIG. 3 depicts a microprocessor application, for example, it is appreciated that stubby line routing in accordance with the present description may be applied to other applications, such as other applications where connector FEXT may be compensated using routing FEXT, for example. Thus, it is believed that memory lines such as DDR lines on a substrate may be routed with overly-capacitive stubby lines to compensate for the connector crosstalk such as DIMM connector crosstalk.

FIG. 5 schematically represents a pair of adjacent I/O channels 127*a*, 127*b*, between a pair of transmitters 150*a*, 150*b* and a pair of receivers 152*a*, 152*b*. Each I/O channel 127*a*, 127*b*, like the I/O channel 127, includes adjacent horizontal microstrip transmission lines 102*a*, 102*b* and adjacent vertical interconnects 120*a*, 120*b*. In this example, a signal input/output similar to the signal input/output 125 of the die 112, may be considered to be a transmitter end 150*a*, 150*b* for an I/O channel 127*a*, 127*b*, transmitting an I/O signal to a conductor trace similar to the conductor trace 118 of the printed circuit board 116. Thus, a conductor trace similar to the conductor trace 118 may be considered a receiver end 152*a*, 152*b* for an I/O channel 127*a*, 127*b*. In accordance with one aspect of the present description, a microstrip transmission line such as the microstrip transmission line 102*a*, has stub-shaped projections (such as the stub-shaped projections 160 (FIG. 4) for example) adapted to compensate simultaneously for both far-end crosstalk induced by inductive coupling between the microstrip transmission line 127*a* and an adjacent microstrip transmission line 127*b*, and also far-end crosstalk induced by inductive coupling 164 between the vertical electrical interconnect 120*a* at the far end of the microstrip transmission line 127*a* and an adjacent vertical electrical interconnect 120*b* electrically connected to the adjacent microstrip transmission line 127*b*.

Figure 6:
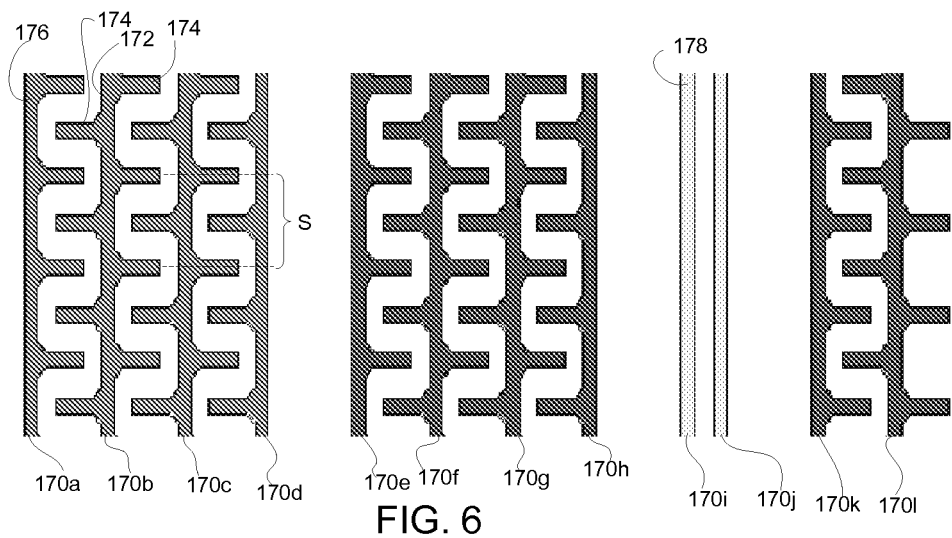
FIG. 6 illustrates sections of microstrip transmission lines including stubby line microstrip transmission lines having capacitances in accordance with one embodiment of the present description.

FIG. 6 is a schematic diagram illustrating sections 170*a*, 170*b*, . . . 170*l*, of adjacent transmission lines having capacitances in accordance with one embodiment of the present description. In a microstrip transmission line embodiment, the transmission lines may be stubby lines which are overly capacitive to compensate not only for far-end crosstalk induced by inductive coupling between the microstrip transmission line and an adjacent microstrip transmission line, but also far-end crosstalk induced by inductive coupling between the vertical electrical interconnect at the far end of the microstrip transmission line and an adjacent vertical electrical interconnect. In a stripline transmission line embodiment, the transmission lines may be stubby lines which are overly capacitive to compensate for far-end crosstalk induced by inductive coupling between the vertical electrical interconnect at the far end of the microstrip transmission line and an adjacent vertical electrical interconnect.

For example, section 170*b* shows a portion of a stubby line microstrip transmission line have a central generally linear conductor 172 and a plurality of stub-shaped projections 174 which project from both sides of the linear conductor 172. The projections 174 on each side of the linear conductor 172 are regularly spaced in this section 170a by a spacing "S". However, the spacings of the projections 174 on one side of the linear conductor 172 are offset by half the projection to projection spacing S with respect to the spacings of the projections 174 on the other side of the linear conductor 172. As a consequence, the projections 174 of adjacent sections 170a, 170b, 170c . . . are interdigitated as shown in FIG. 6.

Not all stubby line microstrip transmission lines may have projections 174 on both sides of the linear conductor 172. Thus, section 170a of a stubby line microstrip transmission line may have may have projections 174 on only one side of the linear conductor 176, that is, the side spaced from the nearest adjacent section 170b. Furthermore, not all sections of a stubby line microstrip transmission line may have projections 174. Thus, section 170i shows a linear conductor 178 which does not have stub-shaped projections 174. However, the section 170i may be part of an I/O channel which has stubby line sections not shown.

In the embodiment depicted in FIG. 6, the projections 174 are shown to be relatively uniform in size and shape. However, it is appreciated that the size and shape of the projections 174 may vary, depending upon the appropriate capacitance and resistance for that section of an I/O channel.

Figures 7A, 7B:
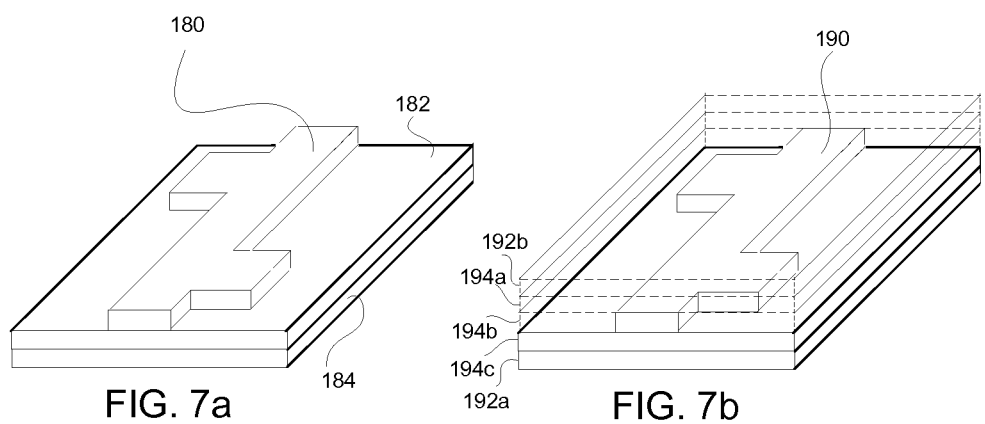
FIGS. 7a, 7b illustrate cross-sections of a stubby line microstrip transmission line and a stubby line stripline transmission line, respectively, having capacitances in accordance with one embodiment of the present description.

Each microstrip transmission line includes a conductor 180 (FIG. 7a) disposed on a dielectric layer 182 which in turn is disposed on a ground plane 184. The dielectric layer 182 and ground plane 184 may be formed in or on the substrate of a package or a printed circuit board, for example.

In a stripline embodiment in accordance with the present description, each stripline transmission line includes a conductor 190 (FIG. 7b) sandwiched between two ground planes 192a, 192b. Dielectric layers 194a, 194b, 194c insulate the conductor 190 from the ground planes 192, 192b. The layers of the stripline transmission line may be formed in or on the substrate of a package or a printed circuit board, for example.

It is believed that putting stubs on stripline transmission lines in a manner similar to that described herein for microstrip transmission lines, can compensate to reduce or eliminate the effect of crosstalk induced by vertical interconnects. Although stripline transmission lines typically do not experience routing crosstalk, it is believed that putting stubs on stripline transmission lines in a manner similar to that described herein for microstrip transmission lines, may nonetheless improve the performance of stripline transmission lines.

Figure 8:
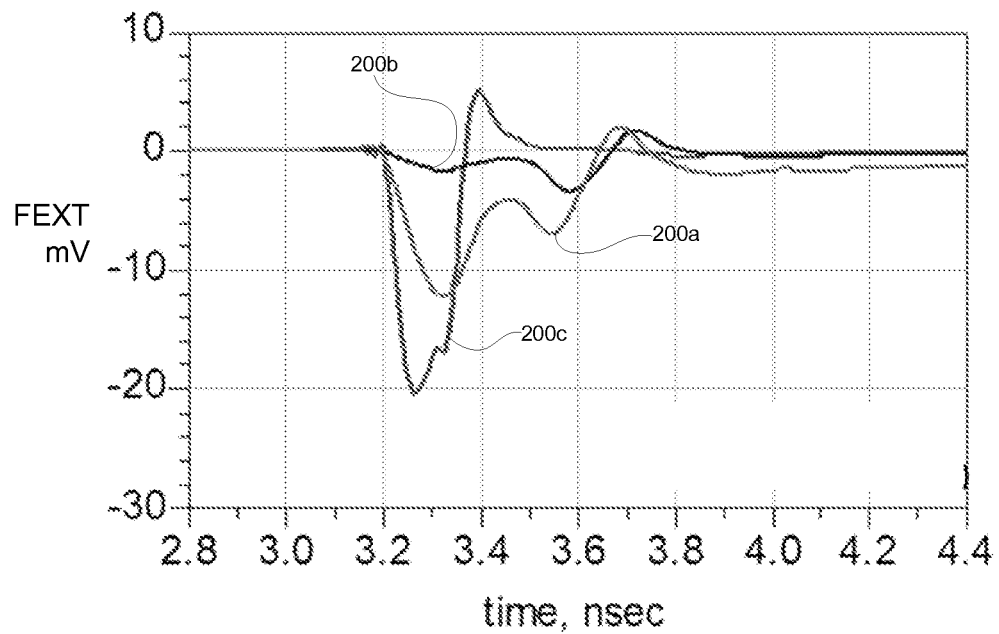
FIG. 8 is a graph depicting results of a simulation to demonstrate FEXT contribution of several package components in a typical 10 channel before application of FEXT compensation in accordance with the present description.

FIG. 8 is a graph depicting results of a simulation to demonstrate FEXT contribution of several package components in a typical 10 channel which does not include FEXT compensation in accordance with the present description. A plot line 200a represents the FEXT contributions of a first package routing which includes a main routing portion which uses microstrip transmission lines, together with the bump escape and breakout portions of the package routing. A plot line 200b represents the FEXT contributions of a second package routing which includes a main routing which uses stripline transmission lines, together with the bump escape and breakout portions of the package routing. As shown in the simulation of FIG. 7, package routing utilizing microstrip transmission lines (without FEXT compensation in accordance with the present description) can have larger FEXT contribution (200a) compared to that (200b) of stripline routing. However, it is recognized herein that the FEXT contribution of the vertical interconnects as depicted in plot line 200c can be the largest as compared to that of the stripline routing (200b) or microstrip routing (200a).

Figure 11:
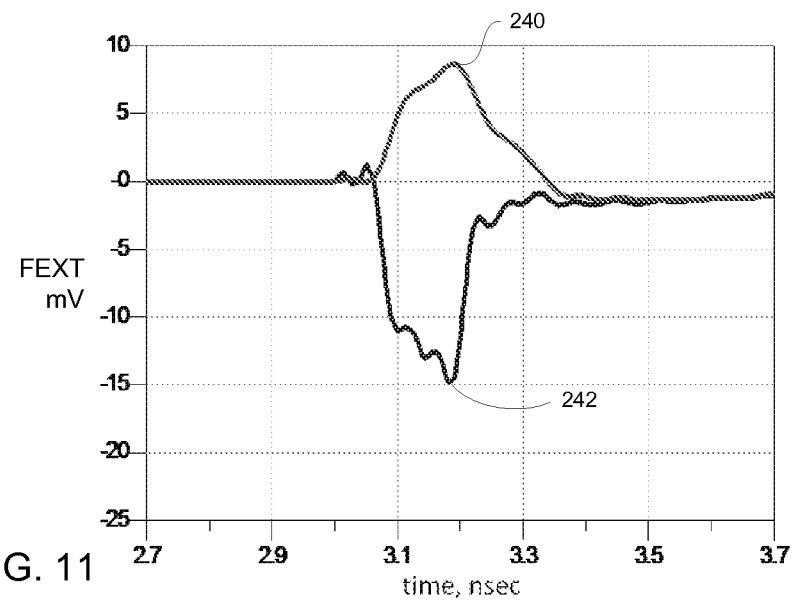
FIG. 11. is a graph depicting results of a simulation which include a comparison of a positive FEXT crosstalk response for a stubby line microstrip transmission line, and a negative FEX crosstalk response for a conventional microstrip transmission line.
Figure 9:
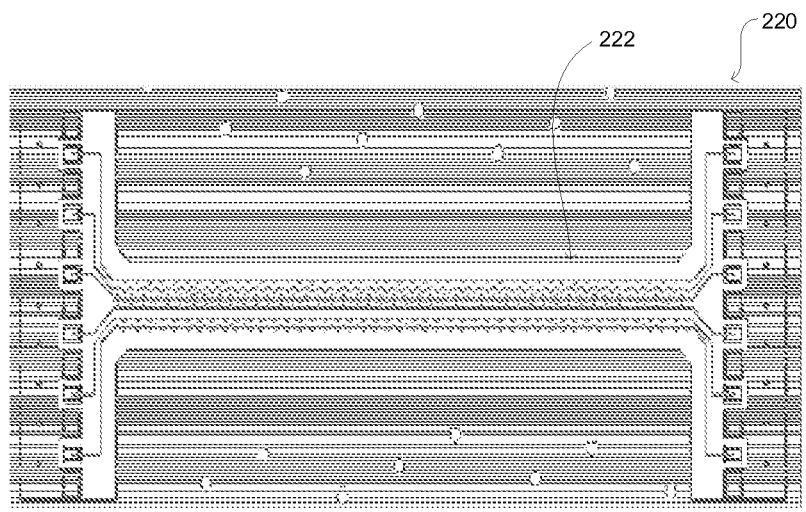
FIGS. 9, 9a depict a passive package test vehicle having stubby line microstrip transmission lines which have overly-capacitive coupling in accordance with the present description.
Figure 9A:
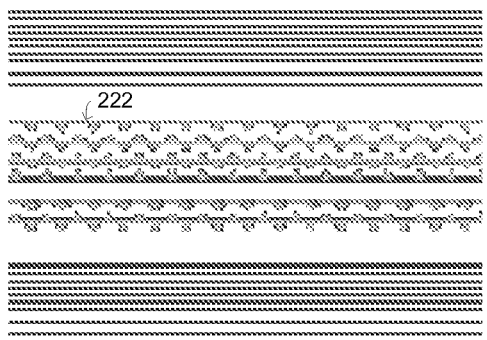
Figure 10A:
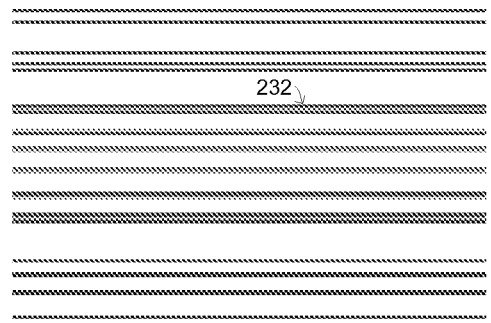
FIGS. 10, 10a depict a passive package test vehicle having conventional microstrip transmission lines.
Figure 10:
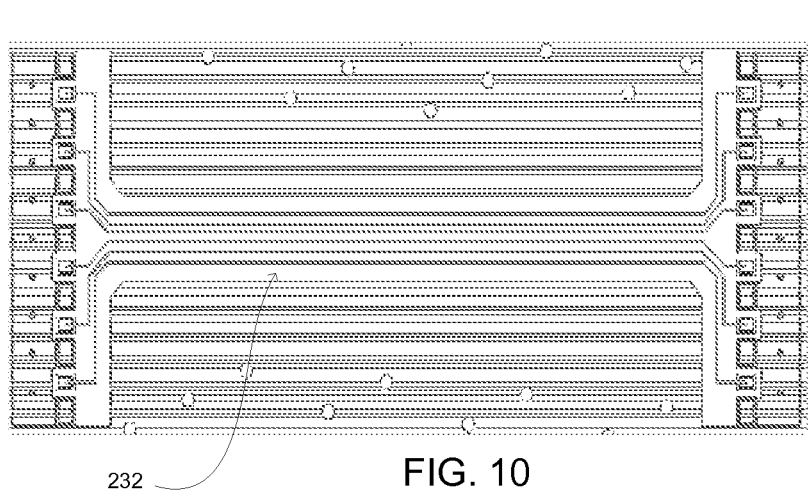

A passive package test vehicle 220 is shown in FIGS. 9, 9a having stubby line microstrip transmission lines 222 which have overly-capacitive coupling in accordance with the present description. For comparison purposes another passive package test vehicle 230 is shown in FIGS. 10, 10a having conventional microstrip transmission lines 232 which lack stubs to provide overly-capacitive coupling. Each test vehicle 220, 230 was characterized using a 12-port Vector Network Analyzer and the transient responses of the microstrip transmission lines 222, 232 were simulated using measured S-parameters. The simulated FEXT responses for a two-aggressor case are plotted in FIG. 11. As shown therein, the response plotline 240 for the stubby line microstrip transmission lines 222, has a positive FEXT crosstalk response. By comparison, the response plotline 242 for conventional microstrip transmission lines 232, has a negative FEXT crosstalk response due to high inductive coupling between the lines.

Accordingly, it is recognized that the positive FEXT resulting from this overly capacitive coupling between the stubby line microstrip transmission lines 102 (FIG. 4), or 222 (FIGS. 9, 9a), may be made sufficiently positive to offset the negative FEXT resulting from the inductive coupling between adjacent vertical interconnects such as the vertical interconnects 120 (FIG. 4) including the adjacent PTH vias 130, socket pins 130, and female socket connectors 124, such that the overall package FEXT can be reduced or eliminated. Therefore, it is recognized that by suitably configuring the stubby line microstrip transmission lines 102, 222, the capacitive ratio $C_m/C_T$ of the stubby line microstrip transmission lines 102, 222 portion of the I/O channel 127 may be optimized such that the capacitive and inductive ratio difference in the equation above can approach or attain zero at the output 118 of the vertical interconnects 120 in the channels 127.

In accordance with another aspect of the present description, the microstrip transmission lines 102 may also have impedance stepping to improve performance characteristics such as impedance matching between different sections on the package 100. Impedance stepping can mitigate increased loss which may be associated with stubby line transmission lines due to their inherently capacitive response. For example, FIG. 4 shows one embodiment, in which the main routing section 129 was routed with three different impedance steps, a first main routing portion 300 comprising conventional microstrip transmission lines which have a first resistance such as 53 Ohms, for example, a second main routing portion 302 comprising stubby line microstrip transmission lines which have a second resistance such as 42 Ohms, for example, which is lower than that of the first main routing portion 300, and a third main routing portion 304 comprising stubby line microstrip transmission lines which have a third resistance such as 37 Ohms, for example, which is lower than that of the second main routing portion 302. The number of sections and the resistance and capacitance values of the sections may vary, depending upon the particular application.

Thus, for example, in the embodiment of FIG. 4, the main conduit 308 and the stub-shaped projections 310 of the stubby line microstrip transmission lines of the third main routing portion 304 may be larger than the main conduit 312 and the stub-shaped projections 160 of the stubby line microstrip transmission lines of the second main routing portion 302 stubby lines, to reduce the resistance of the stubby line microstrip transmission lines of the third main routing portion 304 as compared to that of the stubby line microstrip transmission lines of the second main routing portion 302. The length of each portion 300, 302, 304 and the impedance values for each section may be optimized to introduce a suitable amount of capacitance to minimize package FEXT and achieve a more gradual impedance transition at the same time.

Figure 12:
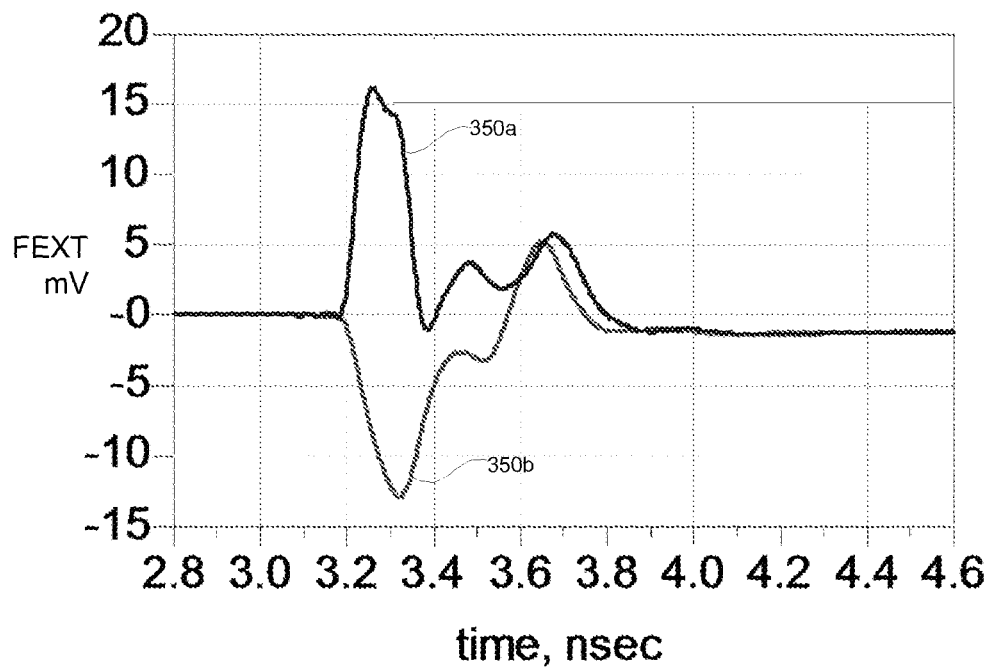
FIG. 12 is a graph depicting results of a simulation which include a comparison of a positive FEXT crosstalk response for a stubby line microstrip transmission line having impedance stepping, and the FEXT response for a non-stubby line microstrip transmission line having impedance stepping.

FIG. 12 is a graph depicting results of a simulation which include a comparison of a FEXT crosstalk response (plot line 350a) for a stubby line microstrip transmission line having impedance stepping, and the FEXT response (plot line 350b) for a non-stubby line microstrip transmission line having impedance stepping. As shown in the graph, stubby line routing can introduce positive FEXT (plot line 350a) while microstrip routing lacking stubby line features can have negative FEXT.

Figure 13:
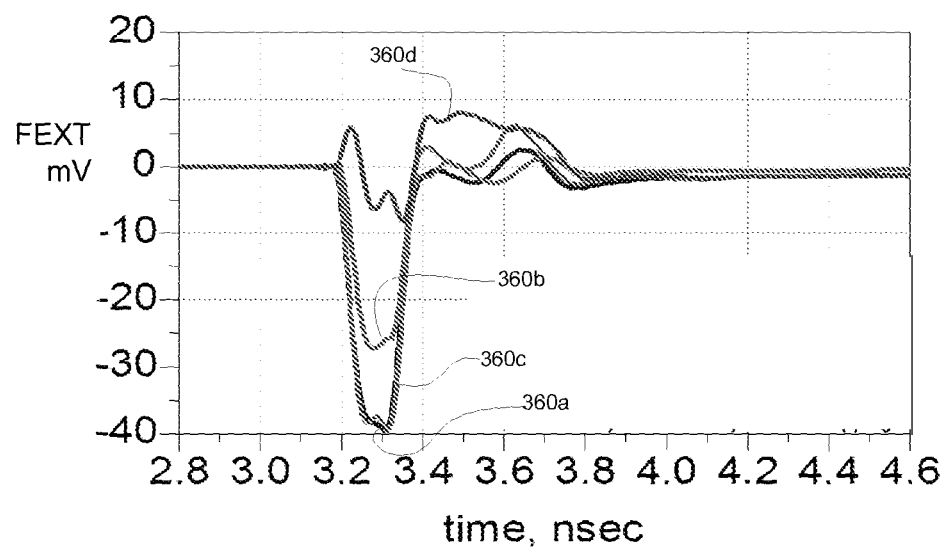
FIG. 13 is a graph depicting results of a simulation which include a comparison of FEXT crosstalk response for a non-stubby line microstrip transmission line without impedance stepping, FEXT crosstalk response for a non-stubby stripline transmission line without impedance stepping, FEXT crosstalk response for a non-stubby line microstrip transmission line having impedance stepping, and FEXT crosstalk response for a stubby line microstrip transmission line having impedance stepping.

FIG. 13 is a graph depicting results of a nearest aggressor case simulation which include a comparison of overall package FEXT crosstalk response (plot line 360a) for a non-stubby line microstrip transmission line without impedance stepping, overall package FEXT crosstalk response (plot line 360b) for a non-stubby stripline transmission line without impedance stepping, overall package FEXT crosstalk response (plot line 360c) for a non-stubby line microstrip transmission line having impedance stepping, and overall package FEXT crosstalk response (plot line 360d) for a stubby line microstrip transmission line having impedance stepping. As shown in the graph of FIG. 13, a package model simulation of a package I/O channel having a stubby line transmission lines (response plot line 360d) can have less crosstalk compared to both conventional stripline (response plot line 360b) and conventional microstrip line (response plot line 360a) cases. It is believed that these simulations indicate that overly-capacitive stubby lines can be used to compensate for the FEXT introduced by vertical interconnects.

Also, the package model simulation of a package I/O channel having a stubby line transmission line (response plot line 360d) can have less crosstalk compared to a non-stubby line microstrip transmission line having impedance stepping (response plot line 360c). Thus, the impedance stepping transitions may facilitate reducing or eliminating reflections and loss associated with overly capacitive transmission lines but may not play a direct role in FEXT mitigation.

Figures 14, 16:
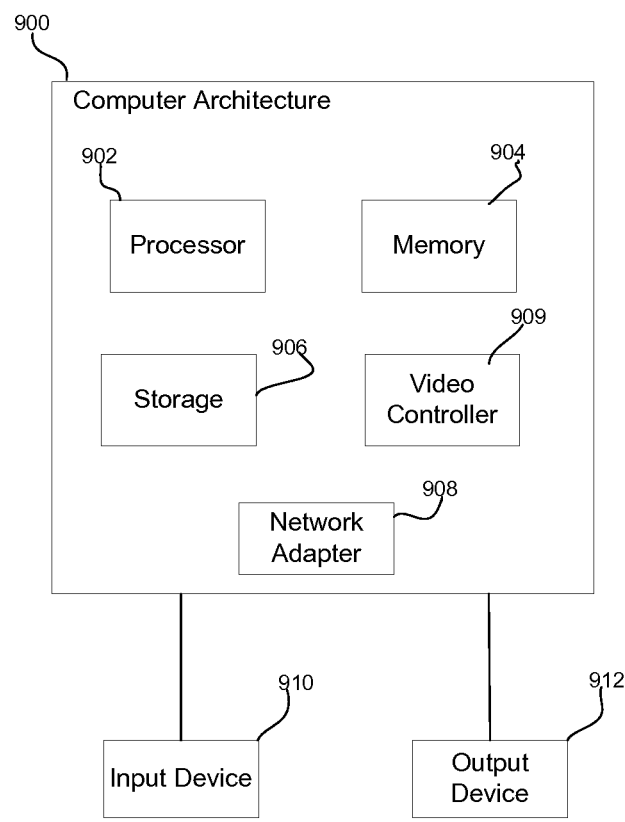
FIG. 14 is a table depicting results of a simulation for a memory, which include a comparison of FEXT crosstalk response for a stubby line microstrip transmission line, and FEXT crosstalk response for a non-stubby stripline transmission line.
FIG. 16 illustrates an embodiment of a system utilizing a substrate using stubby line transmission lines in accordance with one embodiment of the present description.

FIG. 14 is a table depicting results of a simulation for a memory, which include a full channel eye margin comparison of FEXT crosstalk response for a stubby line microstrip transmission line, and FEXT crosstalk response for a non-stubby stripline transmission line. The first row 600 of the table shows a stubby line Z-corner comparison to a stripline case. The second row 610 of the table shows a stubby line FEXT-corner comparison to a stripline case. The simulation represented by the table of FIG. 14 is a full channel level simulation performed for a DDR4 memory channel at transfer rates of 2.4, 2.7 and 3.2 GT/s. The table shows the channel level simulation results indicating a potential for the improvement of the stubby lines over a reference stripline case.

As previously mentioned, to overcome the channel performance degradation typically encountered with package microstrip transmission lines routing, packages have frequently used stripline routing instead, to facilitate meeting high-speed performance targets. However, use of stripline routing frequently may involve an additional two package layers to implement which can increase the overall product cost in many applications. In addition, additional ground PTH vias and sockets pins are frequently used for shielding to mitigate the crosstalk in the vertical interconnects. Such additional ground vertical interconnects can increase the required package and socket form and thus can increase the associated cost to meet the high-speed performance targets.

In accordance with one aspect of the present description, package microstrip stubby lines are configured to reduce FEXT induced by the package routing and the vertical interconnects simultaneously. Examples of such vertical interconnects include the package PTH vias and the socket connectors. In another aspect, the package microstrip stubby lines may be used to more gradually transition changes in impedance from high-impedance regions such as the escape and breakout region in a package, to low-impedance regions such as the PTH vias and socket pins, for example. It is believed that this combination of features can, depending upon the particular application, provide significant performance improvement over the traditional package microstrip transmission lines and parity to better performance compared to the current package stripline solution while reducing the package layers required. Furthermore, in some embodiments, microstrip transmission lines in accordance with the present description may be fabricated in accordance with existing package fabrication processes modified as described herein. Thus, additional package technology beyond that described herein may be avoided in some applications.

ADDITIONAL EMBODIMENT DETAILS

The described techniques for may be embodied as a method, apparatus, computer program product or article of manufacture using standard programming and/or engineering techniques to produce software, firmware, hardware, or any combination thereof. The outputs of on-die circuitry which may include programmable processors, dedicated processors, comparators or adder/subtractor circuits, may be processed by on-die logic circuitry, firmware or software or processed by off chip logic circuitry, firmware or software, or a combination thereof, to process optically transmitted data. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" or "computer program product" may comprise the medium in which the code is embodied. Additionally, the "article of manufacture" "computer program product" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, a substrate having stubby line transmission lines in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the stubby line package embodiments may be embodied in a computing device that does not include, for example, a video controller, such as a switch, router, etc, or does not include a network controller, for example.

Figure 15:
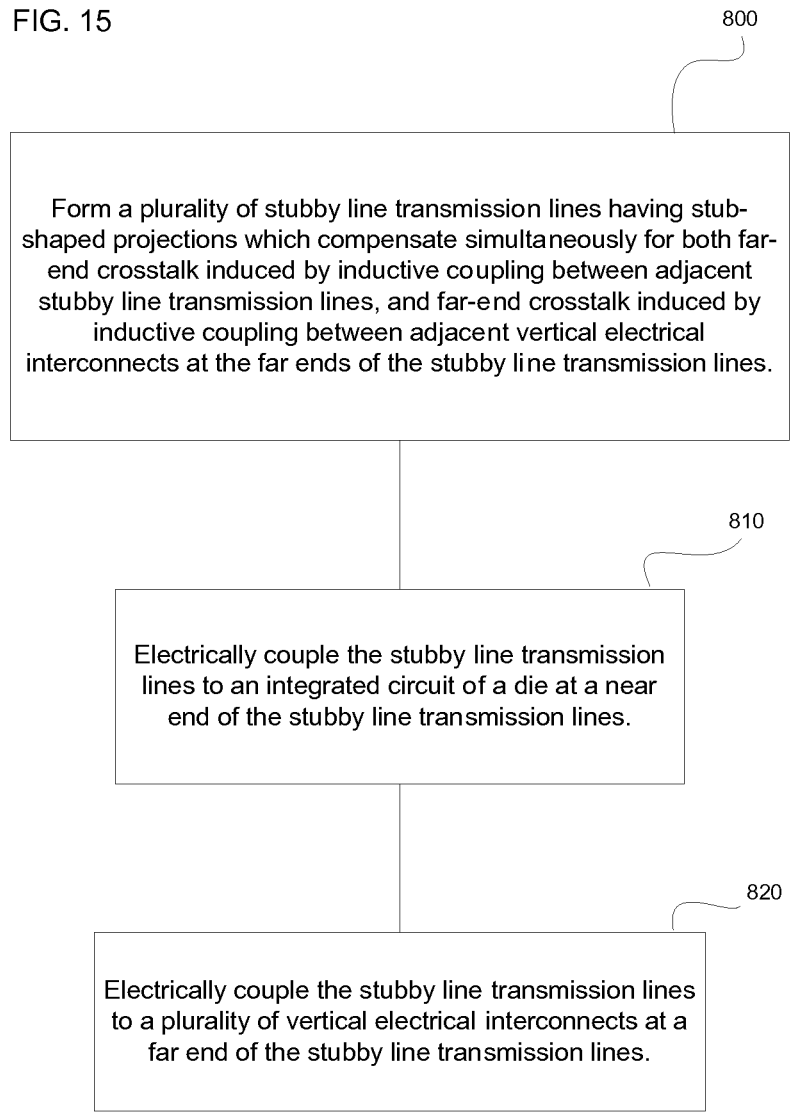
FIG. 15 illustrates an embodiment of operations for forming stubby line transmission lines in accordance with one embodiment of the present description.

FIG. 15 illustrates one embodiment for forming stubby line transmission lines in accordance with one embodiment of the present description. In one operation, a plurality of stubby line transmission lines are formed (block 800) having stub-shaped projections adapted to compensate simultaneously for both far-end crosstalk induced by inductive coupling between the stubby line transmission line and an adjacent stubby line transmission line, and far-end crosstalk induced by inductive coupling between a vertical electrical interconnect at the far end of the stubby line transmission line and an adjacent vertical electrical interconnect electrically connected to the adjacent stubby line transmission line. FIG. 4 shows an example of stubby line microstrip transmission lines 102 which are overly capacitive to provide such compensation.

In another operation, the stubby line transmission lines are electrically connected (block 810) to an integrated circuit of a die such as the die 112 of FIG. 3, at a near end of the stubby line transmission lines. In another operation, the stubby line transmission lines are electrically connected (block 820) to a plurality of vertical electrical interconnects such as the vertical interconnects 120 of FIG. 4, for example.

The operations may be performed by fabrication equipment having controllers or other processors programmed to perform operations. The illustrated logic of FIG. 15 shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

FIG. 16 illustrates one embodiment of a computer architecture 900 of components, any one of which may include a substrate having stubby line transmission lines in accordance with the present description. The computer architecture 900 may comprise any computing device known in the art, such as a mainframe, server, personal computer, workstation, laptop, handheld computer, telephony device, network appliance, virtualization device, storage controller, etc. The architecture 900 may include a processor 902 (e.g., a microprocessor), a memory 904 (e.g., a volatile memory device), and storage 906 (e.g., a non-volatile storage, such as magnetic disk drives, optical disk drives, a tape drive, etc.). The storage 906 may comprise an internal storage device or an attached or network accessible storage. Programs in the storage 906 are loaded into the memory 904 and executed by the processor 902 in a manner known in the art. The architecture further includes a network controller or adapter 908 to enable communication with a network, such as an Ethernet, a Fibre Channel Arbitrated Loop, etc. Further, the architecture may, in certain embodiments, include a video controller 909 to render information on a display monitor, where the video controller 909 may be embodied on a video card or integrated on integrated circuit components mounted on the motherboard. An input device 910 is used to provide user input to the processor 902, and may include a keyboard, mouse, pen-stylus, microphone, touch sensitive display screen, or any other activation or input mechanism known in the art. An output device 912 is capable of rendering information transmitted from the processor 902, or other component, such as a display monitor, printer, storage, etc.

The network adapter 908 may embodied on a network card, such as a Peripheral Component Interconnect (PCI) card, PCI-express, or some other I/O card, or on integrated circuit components mounted on the motherboard. The storage 906 may comprise an internal storage device or an attached or network accessible storage. Programs in the storage 906 are loaded into the memory 904 and executed by the processor 902. Any one or more of the devices of the computer architecture 900 may include one or more integrated circuits having an on-die conversion testing circuit as described herein.

The foregoing description of various embodiments has been presented for the purposes of illustration and description. It is not intended to be exhaustive or to limit to the precise form disclosed. Many modifications and variations are possible in light of the above teaching.

What is claimed is:

1. A system: comprising:
   a printed circuit board having signal line conductors;
   a processor disposed over the printed circuit board;
   a memory electrically connected to the processor;
   a video controller electrically connected to the processor;
   a package substrate disposed over the printed circuit board such that the substrate is vertically displaced relative to the printed circuit board;
   a die supported by the substrate and having an integrated circuit;
   a plurality of transmission lines supported by the substrate and electrically connected to the integrated circuit of the die at a near end of the transmission lines; and
   a plurality of vertical electrical interconnects electrically connected to the transmission lines at a far end of the transmission lines and adapted to vertically and electrically connect the transmission lines to signal line conductors of the printed circuit board,
   wherein each transmission line has stub-shaped projections adapted to compensate simultaneously for both far-end crosstalk induced by inductive coupling between the transmission line and an adjacent transmission line, and far-end crosstalk induced by inductive coupling between the vertical electrical interconnect at the far end of the transmission line and an adjacent vertical electrical interconnect electrically connected to the adjacent transmission line, and
   wherein each transmission line has first and second impedance stepping sections between the near end and far end of the transmission line, each impedance stepping section having a plurality of stub-shaped projections wherein the first impedance stepping section has a higher capacitance and a lower resistance compared to the second impedance stepping section which is positioned between the first impedance stepping section and the near end of the transmission line.

2. The system of claim 1 wherein each vertical electrical interconnect is a pin disposed in and passing vertically through the package substrate.

3. The system of claim 2 wherein the printed circuit board has a socket having a plurality of socket pin receptors, and wherein each pin of the plurality of vertical electrical interconnects is a socket pin adapted to be received by a socket receptor.

4. The system of claim 3 wherein the stub-shaped projections of each transmission line are further adapted to compensate simultaneously for far-end crosstalk induced by inductive coupling between the socket pin receptor coupled to the socket pin electrically connected to the far end of the transmission line, and an adjacent socket pin receptor electrically connected to the socket pin electrically connected to the far end of the adjacent transmission line.

5. The system of claim 1 wherein a signal line conductor of the printed circuit board has a far end crosstalk-induced voltage $V_f$ in response to an input voltage of $V_i$ applied to an input of a transmission line of the plurality of transmission lines of the package substrate, wherein $V_f$ is expressed as $$V_f(t) = \frac{t_f}{2}\left(\frac{C_m}{C_T} - \frac{L_m}{L_s}\right)\frac{dV_i(t-t_f)}{dt},$$

where $t_f$ is the time of flight, $C_T = C_m + C_S$, and $C_m$, $C_S$, $L_m$ and $L_S$ represent the combined mutual capacitance, combined self capacitance, combined mutual inductance and combined self inductance, respectively, between a transmission line and an adjacent transmission line, and between the vertical electrical interconnect at the far end of the transmission line and an adjacent vertical electrical interconnect electrically connected to the adjacent transmission line, and wherein the stub-shaped projections provide additional self and mutual capacitances to increase the ratio $C_m/C_T$ as compared to the ratio $L_m/L_S$, to reduce the far end crosstalk-induced voltage $V_f$.

6. The system of claim 5 wherein the stub-shaped projections provide additional self and mutual capacitances to increase the ratio $C_m/C_T$ to substantially equal the ratio $L_m/L_S$, to reduce the far end crosstalk-induced voltage $V_f$ substantially to zero.

7. The system of claim 1 wherein the transmission lines include microstrip transmission lines.

8. The system of claim 1 wherein the transmission lines include stripline transmission lines.

9. The system of claim 1 wherein each vertical electrical interconnect includes a through-hole via comprising a through hole formed in and passing through the package substrate, and a layer of conductive metal plating the surface of the through hole.

10. A package for use with a printed circuit board having signal line conductors, comprising:
a substrate adapted to be disposed over the printed circuit board such that the substrate is vertically displaced relative to the printed circuit board; a die supported by the substrate and having an integrated circuit;
a plurality of transmission lines supported by the substrate and electrically connected to the integrated circuit of the die at a near end of the transmission lines;
a plurality of vertical electrical interconnects electrically connected to the transmission lines at a far end of the transmission lines and adapted to vertically and electrically connect the transmission lines to signal line conductors of the printed circuit board, wherein each transmission line has stub-shaped projections adapted to compensate simultaneously for both far-end crosstalk induced by inductive coupling between the transmission line and an adjacent transmission line, and far-end crosstalk induced by inductive coupling between the vertical electrical interconnect at the far end of the transmission line and an adjacent vertical electrical interconnect electrically connected to the adjacent transmission line,
wherein each transmission line has first and second impedance stepping sections between the near end and far end of the transmission line, each impedance stepping section having a plurality of stub-shaped projections wherein the first impedance stepping section has a higher capacitance and a lower resistance compared to the second impedance stepping section which is positioned between the first impedance stepping section and the near end of the transmission line.

11. The package of claim 10 wherein each vertical electrical interconnect is a pin disposed in and passing vertically through the package substrate.

12. The package of claim 11 wherein the printed circuit board has a socket having a plurality of socket pin receptors, and wherein each pin of the plurality of vertical electrical interconnects is a socket pin adapted to be received by a socket receptor.

13. The package of claim 12 wherein the stub-shaped projections of each transmission line are further adapted to compensate simultaneously for far-end crosstalk induced by inductive coupling between the socket pin receptor coupled to the socket pin electrically connected to the far end of the transmission line, and an adjacent socket pin receptor electrically connected to the socket pin electrically connected to the far end of the adjacent transmission line.

14. The package of claim 10 wherein a signal line conductor of the printed circuit board has a far end crosstalk-induced voltage $V_f$ in response to an input voltage of $V_i$ applied to an input of a transmission line of the plurality of transmission lines of the package, wherein $V_f$ is expressed as $$V_f(t) = \frac{t_f}{2}\left(\frac{C_m}{C_T} - \frac{L_m}{L_s}\right)\frac{dV_i(t-t_f)}{dt},$$

where $t_f$ is the time of flight, $C_T = C_m + C_S$, and $C_m$, $C_S$, $L_m$ and $L_S$ represent the combined mutual capacitance, combined self capacitance, combined mutual inductance and combined self inductance, respectively, between a transmission line and an adjacent transmission line, and between the vertical electrical interconnect at the far end of the transmission line and an adjacent vertical electrical interconnect electrically connected to the adjacent transmission line, and wherein the stub-shaped projections provide additional self and mutual capacitances to increase the ratio $C_m/C_T$ as compared to the ratio $L_m/L_S$, to reduce the far end crosstalk-induced voltage $V_f$.

15. The package of claim 14 wherein the stub-shaped projections provide additional self and mutual capacitances to increase the ratio $C_m/C_T$ to substantially equal the ratio $L_m/L_S$, to reduce the far end crosstalk-induced voltage $V_f$ substantially to zero.

16. The package of claim 10 wherein the transmission lines include microstrip transmission lines.

17. The package of claim 10 wherein the transmission lines include stripline transmission lines.

18. The package of claim 10 wherein each vertical electrical interconnect includes a through-hole via comprising a through hole formed in and passing through the package substrate, and a layer of conductive metal plating the surface of the through hole.

19. A computer program product, for controlling fabrication of transmission lines, the computer program product comprising a non-transitory computer readable storage medium having computer readable program code embodied therein that executes with a processor to perform fabrication operations, the operations comprising:

forming a plurality of transmission lines on a substrate of a package for use with a printed circuit board having signal line conductors, and for packaging a die having an integrated circuit; electrically coupling the transmission lines to the integrated circuit of the die at a near end of the transmission lines; electrically coupling the transmission lines to a plurality of vertical electrical interconnects for vertically and electrically coupling the transmission lines to signal line conductors of the printed circuit board, wherein the transmission line forming includes forming on each transmission line, stub-shaped projections adapted to compensate simultaneously for both far-end crosstalk induced by inductive coupling between the transmission line and an adjacent transmission line, and far-end crosstalk induced by inductive coupling between the vertical electrical interconnect at the far end of the transmission line and an adjacent vertical electrical interconnect electrically connected to the adjacent transmission line, and wherein the transmission line forming includes forming on each transmission line first and second impedance stepping sections between the near end and far end of the transmission line, each impedance stepping section having a plurality of stub-shaped projections wherein the first impedance stepping section has a higher capacitance and a lower resistance compared to the second impedance stepping section which is positioned between the first impedance stepping section and the near end of the transmission line.

20. The computer program product of claim 19 wherein each vertical electrical interconnect is a pin disposed in and passing vertically through the package substrate.

21. The computer program product of claim 20 wherein the printed circuit board has a socket having a plurality of socket pin receptors, and wherein each pin of the plurality of vertical electrical interconnects is a socket pin adapted to be received by a socket receptor.

22. The computer program product of claim 21 wherein the stub-shaped projections of each transmission line are further adapted to compensate simultaneously for far-end crosstalk induced by inductive coupling between the socket pin receptor coupled to the socket pin electrically connected to the far end of the transmission line, and an adjacent socket pin receptor electrically connected to the socket pin electrically connected to the far end of the adjacent transmission line.

23. The computer program product of claim 19 wherein a signal line conductor of the printed circuit board has a far end crosstalk-induced voltage $V_f$ in response to an input voltage of $V_i$ applied to an input of a transmission line of the plurality of transmission lines of the package, wherein $V_f$ is expressed as $$V_f(t) = \frac{t_f}{2}\left(\frac{C_m}{C_T} - \frac{L_m}{L_S}\right)\frac{dV_i(t-t_f)}{dt},$$

where $t_f$ is the time of flight, $C_T = C_m + C_S$, and $C_m$, $C_S$, $L_m$ and $L_S$ represent the combined mutual capacitance, combined self capacitance, combined mutual inductance and combined self inductance, respectively, between a transmission line and an adjacent transmission line, and between the vertical electrical interconnect at the far end of the transmission line and an adjacent vertical electrical interconnect electrically connected to the adjacent transmission line, and wherein the stub-shaped projections provide additional self and mutual capacitances to increase the ratio $C_m/C_T$ as compared to the ratio $L_m/L_S$, to reduce the far end crosstalk-induced voltage $V_f$.

24. The computer program product of claim 23 wherein the stub-shaped projections provide additional self and mutual capacitances to increase the ratio $C_m/C_T$ to substantially equal the ratio $L_m/L_S$, to reduce the far end crosstalk-induced voltage $V_f$ substantially to zero.

25. The computer program product of claim 19 wherein the transmission lines include microstrip transmission lines.

26. The computer program product of claim 19 wherein the transmission lines include stripline transmission lines.

27. The computer program product of claim 19 wherein each vertical electrical interconnect includes a through-hole via comprising a through hole formed in and passing through the package substrate, and a layer of conductive metal plating the surface of the through hole.

28. A method, comprising: forming a plurality of transmission lines on a substrate of a package for use with a printed circuit board having signal line conductors, and for packaging a die having an integrated circuit; electrically coupling the transmission lines to the integrated circuit of the die at a near end of the transmission lines; electrically coupling the transmission lines to a plurality of vertical electrical interconnects for vertically and electrically coupling the transmission lines to signal line conductors of the printed circuit board, wherein the transmission line forming includes forming on each transmission line, stub-shaped projections adapted to compensate simultaneously for both far-end crosstalk induced by inductive coupling between the transmission line and an adjacent transmission line, and far-end crosstalk induced by inductive coupling between the vertical electrical interconnect at the far end of the transmission line and an adjacent vertical electrical interconnect electrically connected to the adjacent transmission line, and wherein the transmission line forming includes forming on each transmission line first and second impedance stepping sections between the near end and far end of the transmission line, each impedance stepping section having a plurality of stub-shaped projections wherein the first impedance stepping section has a higher capacitance and a lower resistance compared to the second impedance stepping section which is positioned between the first impedance stepping section and the near end of the transmission line.

29. The method of claim 28 wherein each vertical electrical interconnect is a pin disposed in and passing vertically through the package substrate.

30. The method of claim 29 wherein the printed circuit board has a socket having a plurality of socket pin receptors, and wherein each pin of the plurality of vertical electrical interconnects is a socket pin adapted to be received by a socket receptor.

31. The method of claim 30 wherein the stub-shaped projections of each transmission line are further adapted to compensate simultaneously for far-end crosstalk induced by inductive coupling between the socket pin receptor coupled to the socket pin electrically connected to the far end of the transmission line, and an adjacent socket pin receptor electrically connected to the socket pin electrically connected to the far end of the adjacent transmission line.

32. The method of claim 28 wherein a signal line conductor of the printed circuit board has a far end crosstalk-induced voltage $V_f$ in response to an input voltage of $V_i$ applied to an input of a transmission line of the plurality of transmission lines of the package, wherein $V_f$ is expressed as $$V_f(t) = \frac{t_f}{2}\left(\frac{C_m}{C_T} - \frac{L_m}{L_s}\right)\frac{dV_i(t-t_f)}{dt},$$

where $t_f$ is the time of flight, $C_T = C_m + C_S$, and $C_m$, $C_S$, $L_m$ and $L_S$ represent the combined mutual capacitance, combined self capacitance, combined mutual inductance and combined self inductance, respectively, between a transmission line and an adjacent transmission line, and between the vertical electrical interconnect at the far end of the transmission line and an adjacent vertical electrical interconnect electrically connected to the adjacent transmission line, and wherein the stub-shaped projections provide additional self and mutual capacitances to increase the ratio $C_m/C_T$ as compared to the ratio $L_m/L_S$, to reduce the far end crosstalk-induced voltage $V_f$.

33. The method of claim 32 wherein the stub-shaped projections provide additional self and mutual capacitances to increase the ratio $C_m/C_T$ to substantially equal the ratio $L_m/L_S$, to reduce the far end crosstalk-induced voltage $V_f$ substantially to zero.

34. The method of claim 28 wherein the transmission lines include microstrip transmission lines.

35. The method of claim 28 wherein the transmission lines include stripline transmission lines.

36. The method of claim 28 wherein each vertical electrical interconnect includes a through-hole via comprising a through hole formed in and passing through the package substrate, and a layer of conductive metal plating the surface of the through hole.

\* \* \* \* \*